US006746884B2

(12) United States Patent
Suzuki

(10) Patent No.: US 6,746,884 B2
(45) Date of Patent: Jun. 8, 2004

(54) METHOD OF MANUFACTURING FIELD-EMISSION ELECTRON EMITTERS AND METHOD OF MANUFACTURING SUBSTRATES HAVING A MATRIX ELECTRON EMITTER ARRAY FORMED THEREON

(75) Inventor: Koji Suzuki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 42 days.

(21) Appl. No.: 10/092,440

(22) Filed: Mar. 8, 2002

(65) Prior Publication Data

US 2002/0182761 A1 Dec. 5, 2002

(30) Foreign Application Priority Data

Mar. 29, 2001 (JP) ....................................... 2001-097119

(51) Int. Cl.[7] ................................................ H01L 21/00

(52) U.S. Cl. ............................ 438/20; 438/22; 438/30; 438/34; 257/10; 257/13; 257/79; 257/82; 257/88; 257/92; 345/30; 345/33; 345/40; 345/44; 345/55; 345/82

(58) Field of Search ......................... 438/20–22, 30–35; 257/10–13, 79–97; 345/39–46, 55, 82, 30–38

(56) References Cited

U.S. PATENT DOCUMENTS

| | | | | | |
|---|---|---|---|---|---|
| 5,359,256 | A | * | 10/1994 | Gray | 313/169 |
| 5,550,435 | A | * | 8/1996 | Kuriyama et al. | 315/169.1 |
| 5,721,472 | A | * | 2/1998 | Browning et al. | 315/169.1 |
| 6,153,978 | A | * | 11/2000 | Okamoto | 315/169.3 |
| 6,231,412 | B1 | * | 5/2001 | Kawade et al. | 445/3 |
| 6,473,388 | B1 | * | 10/2002 | Gibson | 369/126 |
| 2001/0022623 | A1 | * | 9/2001 | Funakoshi et al. | 348/311 |

FOREIGN PATENT DOCUMENTS

| | | | | |
|---|---|---|---|---|
| JP | 5-12986 | | 1/1993 | |
| JP | 5-275718 | * | 10/1993 | H01L/29/90 |
| JP | 2000-311601 | | 11/2000 | |

OTHER PUBLICATIONS

E. Yamaguchi, et al., “A 10–in. Surface–Conduction Electron–Emitter Display”, Journal of the SID, 1997, Vol 5/4, pp. 345–348.

* cited by examiner

*Primary Examiner*—Matthew Smith
*Assistant Examiner*—Granvill D Lee, Jr.
(74) *Attorney, Agent, or Firm*—Oblon, Spivak, McClelland, Maier & Neustadt, P.C.

(57) ABSTRACT

In a method of manufacturing matrix electron emitter arrays, each array comprising a plurality of scanning lines formed on a glass substrate and arranged in parallel with each other, a plurality of signal lines formed in a direction to cross the scanning lines and arranged in parallel with each other, and field-emission type electron emitters formed in the pixel areas which are arranged at the intersections of the scanning lines and the signal lines, a pulse voltage with a specific polarity and another pulse voltage with the reverse polarity are applied to any two of the scanning lines and current is caused to flow through electron emitters connected in series-via a signal line, thereby subjecting the conductive thin film constituting an electron emitter to a conductive activation process for forming an electron emitting section.

21 Claims, 9 Drawing Sheets

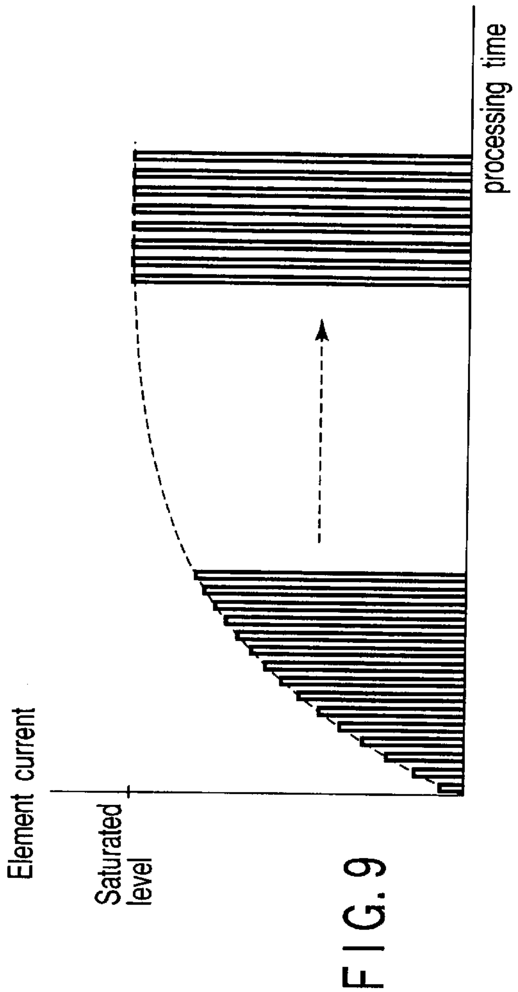
F I G. 9
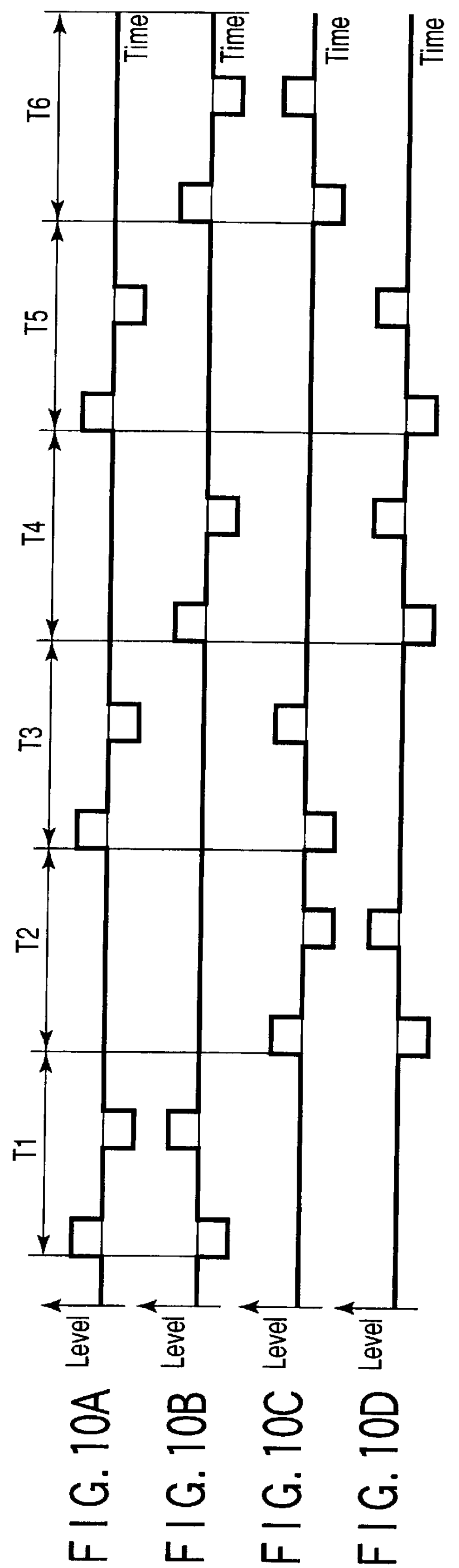
F I G. 10A
F I G. 10B
F I G. 10C
F I G. 10D

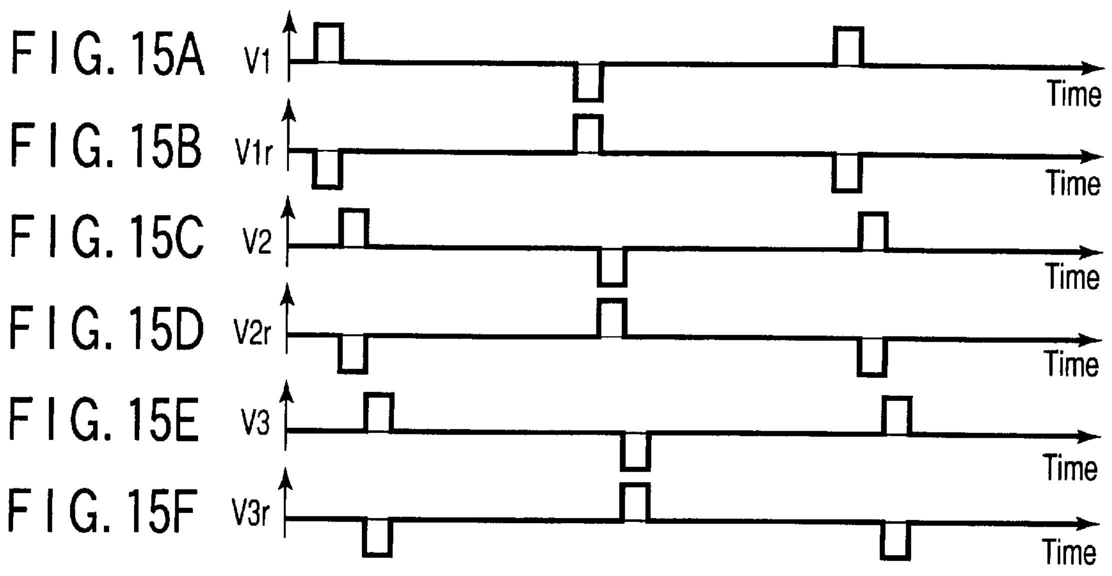
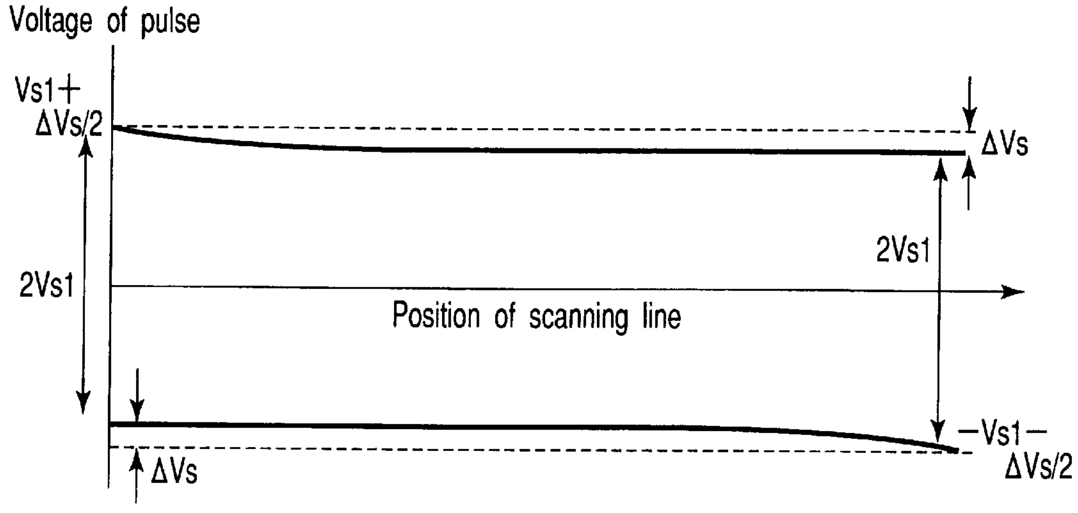
FIG. 17

METHOD OF MANUFACTURING FIELD-EMISSION ELECTRON EMITTERS AND METHOD OF MANUFACTURING SUBSTRATES HAVING A MATRIX ELECTRON EMITTER ARRAY FORMED THEREON

CROSS-REFERENCE TO RELATED APPLICATIONS

This application is based upon and claims the benefit of priority from the prior Japanese Patent Application No. 2001-097119, filed Mar. 29, 2001, the entire contents of which are incorporated herein by reference.

BACKGROUND OF THE INVENTION

1. Field of the Invention

This invention relates to the techniques for manufacturing field-emission type electron emitters, and more particularly to a method of manufacturing field-emission type electron emitters which has improved a conductive activation process, and further, to a method of manufacturing substrates on which a matrix electron emitter array with field-emission type electron emitters arranged in a matrix has been formed.

2. Description of the Related Art

In recent years, an electron beam excitation fluorescent display unit using surface conduction emitters, that is, field-emission type electron emitters, has been attracting attention as a large-screen and thin display. This display unit has the following various merits: the surface conduction emitters are formed using printing techniques; the same principle of light ray emission as that of the cathode-ray tube is used because of the fluorescent material excitation light ray emission caused by electrons; and low-breakdown voltage driving ICs can be used because the surface conduction emitters can be driven at a voltage of a little higher than ten volts.

The basic configuration, manufacturing method, and driving method have been described in detail in reference (E. Yamaguchi, et. al., "A 10-in. SCE-emitter display," Journal of SID, Vol. 5, p. 345, 1997).

A method of manufacturing surface conduction emitters of this type has been disclosed in, for example, Jpn. Pat. Appln. KOKAI Publication No. 2000-331599. In this method, a pair of electrode patterns is formed on a substrate and a conductive thin film is formed between these electrode patterns. Then, the conductive thin film is subjected to a conducting process, thereby carrying out a forming process, with the result that electron emitters are formed. Specifically, a triangular pulse voltage is applied to a pair of electrodes. When the voltage is raised gradually, part of the conductive thin film breaks, deforms, or deteriorates, with the result that it is changed into a structure suitable for electron emission. The forming process is completed when the low triangular voltage pulse current, which is being monitored, becomes sufficiently small. Through this process, an electron emitting section for emitting electrons is formed at the conductive thin film.

To increase the electron emitting capability, the aforementioned conductive activation process is carried out under vacuum. Specifically, in an atmosphere of organic material, a pulse voltage as shown in FIG. 1A is applied between electrode E1 and electrode E2 forming a pair constituting a surface conduction emitter schematically shown in FIG. 1B, thereby forming an electron emitting section formed in the forming process and a thin film made of carbon and carbon compounds near the emitting section. The element current flowing between the two electrodes during conductive activation is increased gradually and saturated. When the current is saturated, the surface conduction emitter is completed.

Although a single surface conduction emitter has been explained for the sake of simplicity in FIG. 1B, a display unit has a large number of surface conduction emitters arranged in a matrix. In a method of forming electron emitters arranged in a matrix, the electrodes and conductive films are formed by printing, resist application, exposure, etching, and other processes as in ordinary thin-film processes. Since the forming process and activation process require a conducting process, the X and Y row lines and column lines are caused to conduct as shown in FIG. 3. For example, the column lines are connected in common to the ground (GND). The row lines are selected sequentially and a pulse voltage shown in FIG. 1A is applied to them in this order: S1, S2, S3, . . . .

The surface conduction emitters formed in this way are provided so as to face a fluorescent material substrate on which a fluorescent material pattern has been formed. The surface conduction emitters are combined with the fluorescent material substrate to form vacuum cells. The vacuum cells are connected to an external driving circuit, thereby completing a display unit. A display signal voltage is applied to each of the electron emitters, which emit electrons according to the display. As a result, the fluorescent material formed on the opposite substrate is excited, emitting light rays, which displays an image. As described in detail in Jpn. Pat. Appln. KOKAI Publication No. 2000-331599, the driving method is a line sequence method. That is, the voltages corresponding to the display signals are applied to the corresponding electron emitters.

In a fluorescent display unit where the surface conduction emitters are arranged in a matrix, a pulse voltage is applied to the surface conduction emitter corresponding to each pixel by the line sequence method, thereby emitting electrons. At this time, the luminance changes according to the amount of emitted electrons, displaying gradation. Gradation display is achieved by a method of changing the pulse width of the pulse voltage applied to the electron emitters or a method of changing the voltage amplitude of the pulse voltage. At this time, to obtain a good image, it is important that the electron emission characteristic of each surface conduction emitter is the same.

However, in the actually formed surface conduction emitters, their characteristics vary because of variations in the pattern dimensions of the conductive thin film, variations in the thickness of the conductive thin film, and variations in the characteristic of the electron emitting section formed in the forming process. The variations in the characteristics cause the problem of adversely affecting the display characteristics. This is because a sharp rise in the current-voltage characteristic of a surface conduction emitter as shown in FIG. 4 causes a slight difference of the characteristic to make variations in the output current larger.

As described above, in a conventional method of manufacturing field-emission type electron emitters, a conductive thin film is subjected to a conductive activation process, thereby forming an electron emitting section. The activation process, however, is not carried out uniformly all over the electron emitters, which causes the problem of permitting the electron emitters to vary in characteristic. Variations in the characteristics of the electron emitters contribute to the deterioration of display quality when a display unit is constructed.

BRIEF SUMMARY OF THE INVENTION

An object of the present invention is to provide a method of manufacturing field-emission type electron emitters which enables field-emission type electron emitters to be manufactured with high uniformity and helps improve display quality when being applied to a display unit.

Another object of the present invention is to provide a method of manufacturing matrix electron emitter array substrates which decreases variations in the characteristics of the electron emitters remarkably even when using field-emission type electron emitters and enables display quality to be improved.

According to an aspect of the present invention, there is provided a method of manufacturing field-emission type electron emitter unit comprising a plurality of field emission type electron emitters, each of the electron emitters comprising a pair of electrodes formed on an insulating substrate, a conductive thin film formed between the pair of electrodes, and an electron emitting section formed in the conductive thin film, the method comprising:

supplying current to the electron emitters being connected in series for forming the electron emitting sections.

According to another aspect of the present invention, there is provided a method of manufacturing field-emission type electron emitters, comprising:

forming a plurality of pairs of electrodes on an insulating substrate, each of the pairs of electrodes being adjacent;

forming a conductive thin film between the pairs of electrodes; and forming the electron emitting sections by supplying current to the electron emitters connected in series.

According to still another aspect of the present invention, there is provided a method of manufacturing a matrix electron emitter array substrate comprising an insulating substrate, a plurality of scanning lines which are formed on the insulating substrate to be substantially parallel with each other, a plurality of signal lines which are formed in a direction to cross the scanning lines to be substantially parallel with each other, the signal lines being isolated from the scanning lines, and field emission type electron emitters which are formed in the pixel areas defined by intersections of the scanning lines and the signal lines and which are arranged in a matrix, and each of the field emission type electron emitters comprising a pair of electrodes formed on the insulating substrate, one of the pair of electrodes connected to one of the scanning lines and another of the pair of electrodes connected to one of the signal lines, a conductive thin film formed between the pair of electrodes, and an electron emitting section formed in the conductive thin film, the method comprising:

forming the electron emitting sections by supplying current to the electron emitters connected in series.

According to still another aspect of the present invention, there is provided a method of manufacturing a matrix electron emitter array substrate comprising an insulating substrate, a plurality of row lines which are formed on the insulating substrate to be substantially parallel with each other, a plurality of column lines which are formed on the insulating substrate to be substantially parallel with each other in a direction to cross the row lines, the column lines isolated from the row lines, field emission type electron emitters which are formed in pixel areas defined by intersections of the row lines and the column lines, the method comprising:

forming pairs of electrodes arranged in a matrix on the insulating substrate, one end of each pair of the electrodes connected to one of the row lines and the other end of each pair of the electrodes connected to one of the column lines, forming a conductive thin film between the electrodes in each pair; and supplying current to the electron emitters connected in series to form the electron emitting sections.

BRIEF DESCRIPTION OF THE SEVERAL VIEWS OF THE DRAWING

FIG. 9 shows the change of an element current with the processing time to help explain a method of manufacturing field-emission type electron emitters according to the first embodiment;

FIGS. 10A to 10D are waveform diagrams of pulses applied to electron emitters, which help explain a method of field-emission type electron emitters according to a second embodiment of the present invention;

FIGS. 15A to 15F are schematic waveform diagrams of pulse voltages applied to the scanning lines, which help explain a method of manufacturing plane field-emission emitters according to the third embodiment;

FIG. 17 is a graph showing the relationship between the position of a scanning line and the applied voltage to an electron emitter, which helps explain a method of manufacturing plane field-emission emitters according to the fourth embodiment.

DETAILED DESCRIPTION OF THE INVENTION

Hereinafter, referring to the accompanying drawings, embodiments of a method of manufacturing plane field-emission emitters according to the present invention will be explained.

To begin with, how the idea of manufacturing field-emission emitters of this invention struck the inventor will be described together with the principle of the invention.

A study of variations in the characteristics of surface conduction emitters made by the inventor of this invention has shown the following facts. When a surface conduction emitter was subjected to a conductive activation process, its element current increased gradually and eventually was saturated. There was a correlation between its saturated current Ifsat and the element current flowed in the operation after the formation of the emitter was completed. The larger the saturated current Ifsat, the larger the operating current of the emitter. The element current If presented a nonlinear characteristic of the Faller-Nordheim type. The emission current Ie emitted from the electron emitter correlated with the element current If. That is, the larger the element current If, the larger the emission current Ie. As described above, it has become clear that variations in the emission current of the emitter correlated strongly with variations in the saturated current Ifsat during the activation process. Thus, to reduce variations in the characteristics of the emitter, it is important to decrease variations in the saturated current Ifsat.

Figure 1A:
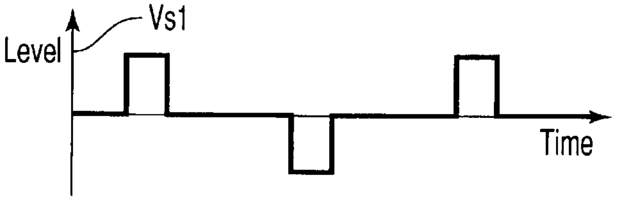
FIGS. 1A and 1B schematically show the waveform of a pulse voltage applied to a conventional conductive activation method for surface conduction emitters and an electron emitter to which the pulse is applied.
Figure 1B:
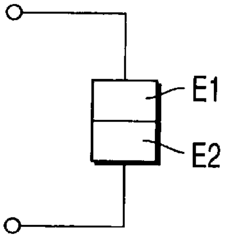
Figure 2:
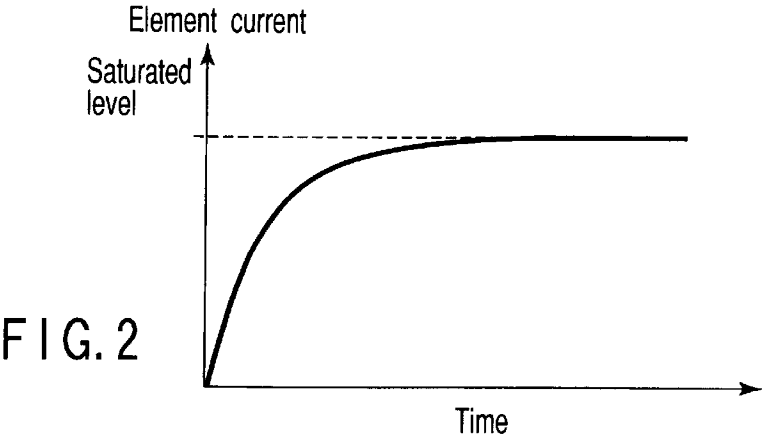
FIG. 2 is a graph related to an element current flowing between the two electrodes during conductive activation in the conventional conductive activation method for surface conduction emitters.
Figure 3:
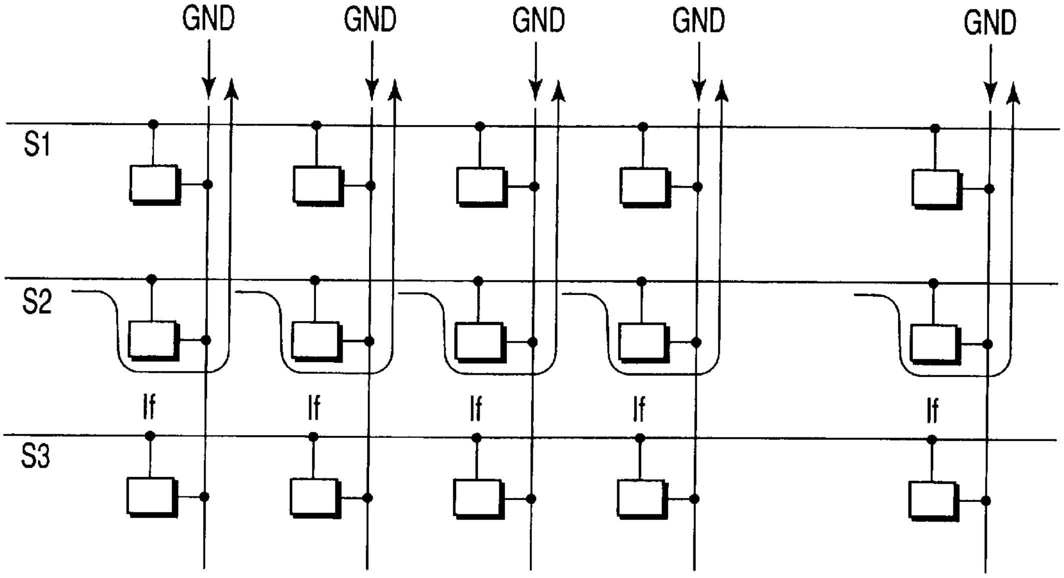
FIG. 3 is an equivalent circuit diagram showing the connection relationship between electron emitters to help explain a conventional method of manufacturing matrix electron emitter arrays.
Figure 4:
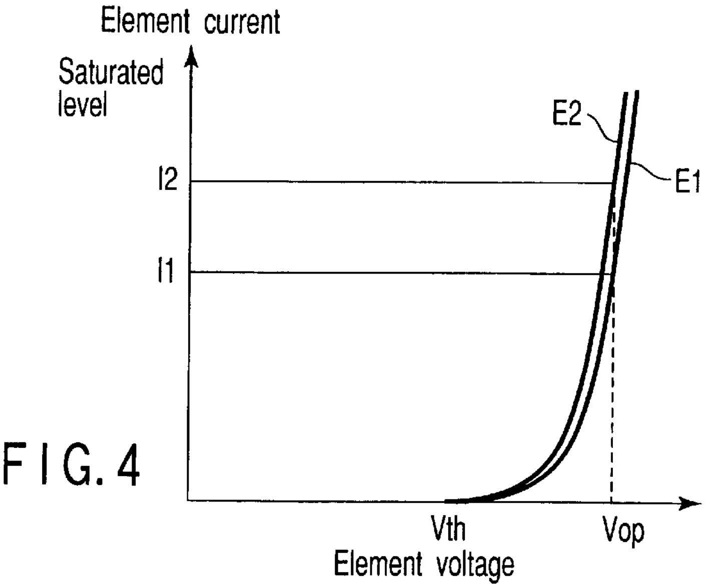
FIG. 4 shows the voltage-current characteristic of an electron emitter.
Figure 5A:
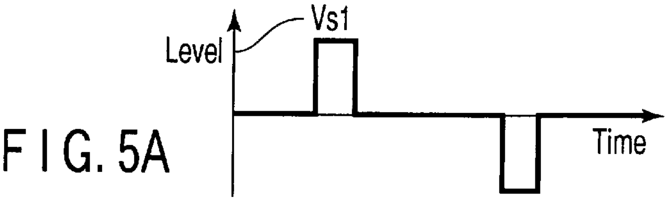
FIGS. 5A to 5D are waveform diagrams to help explain a method of manufacturing field-emission type electron emitters according to the present invention, a schematic diagram showing the connection of electron emitters, and a waveform diagram of a pulse current flowing through the electron emitters.
Figure 5B:
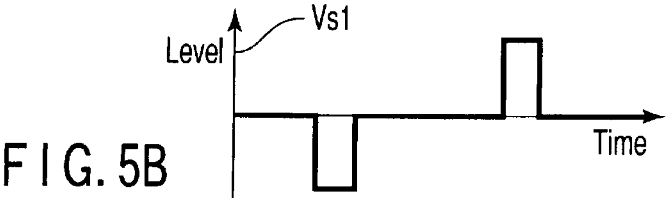
Figure 5C:
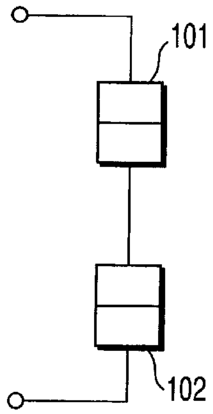
Figure 5D:
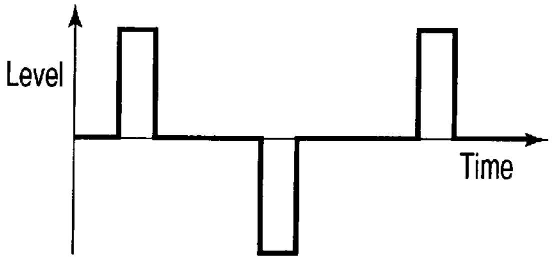

In this invention, there is provided a method of activating a surface conduction emitter for equalizing further the saturated current value of the element current in the conductive activation process. Specifically, with a plurality of surface conduction emitters connected in series, the emitters are activated by conduction. For example, as shown in FIG. 5C, with two surface conduction emitters 101, 102 connected in series, rectangular alternating-current pulse voltages which have waveforms with opposite polarities to each other as shown in FIGS. 5A and 5B are applied to both ends of the series circuit, with the result that the electron emitters 101, 102 are activated by the current as shown in FIG. 5D. In this case, the currents flowing through the two electron emitters 101, 102 are always equal. Thus, the values of the saturated currents for activation with a waveform as shown in FIG. 5D are also equal at both emitters. As a result, the current-voltage characteristics of the two completed surface conduction emitters 101, 102 almost coincide with one another, which reduces variations in the emission current remarkably.

The manufacturing method of activating a plurality of series-connected surface conduction emitters by conduction can be applied to a configuration where a large number of electron emitters are arranged in a matrix for a display unit. With this method, variations in the electron emitters at the display face are reduced, which improves the display characteristics remarkably. Furthermore, with this method, when the surface conduction emitters arranged in a matrix are subjected to a conductive activation process, just applying an activating voltage pulse to either the rows or the columns enables a plurality of activated surface conduction emitters to be produced without applying a special bias voltage to the other lines.

For example, a positive voltage pulse is applied to some lines of the scanning line group, or some scanning lines, and in synchronization with this, a negative pulse is applied to other lines of the scanning line group, or some scanning lines. At this time, since the electron emitters connected to both of the scanning lines are connected in series via signal lines, the series-connected surface conduction emitters are subjected to the conductive activation process. This hardly permits variations in the characteristics of a pair of series-connected electron emitters to occur. At this time, the remaining scanning lines are kept at the GND potential, which permits almost no voltage to be applied to the electron emitters of the scanning lines.

Furthermore, since the sequential switching of the combinations of the scanning lines to which the positive and negative voltages are applied realizes various pairs of electron emitters, the characteristics of the electron emitters along a certain signal line or modulation line can be set almost equal, which reduces variations. The electron emitters along the signal line cannot be connected in series with the electron emitters along an adjoining signal line. However, the characteristics of the electron emitters along the signal line can be regarded as the average value of all these electron emitters. The value almost coincides with the average value of the electron emitters along the adjoining signal line. As a result, the characteristics of the electron emitters along the essentially adjoining signal line are almost equal, which reduces variations in the characteristics of the electron emitters remarkably. The characteristics of the electron emitters along a sufficiently separate signal line do not necessarily coincide with the characteristics of those along the signal line. However, since the characteristics of the electron emitters change monotonously between the two signal lines, a good picture quality is obtained in terms of display characteristics.

As described above, with the present invention, variations in the characteristics of the plane field-emission type electron emitters can be improved remarkably by the manufacturing method characterized by activating a plurality of series-connected surface conduction emitters by conduction. This makes it possible to realize an electron beam excitation fluorescent display unit with excellent uniformity.

Embodiments related to a method of manufacturing surface conduction emitters based on the above-described principle will be explained hereinafter.

(First Embodiment)

Figure 6:
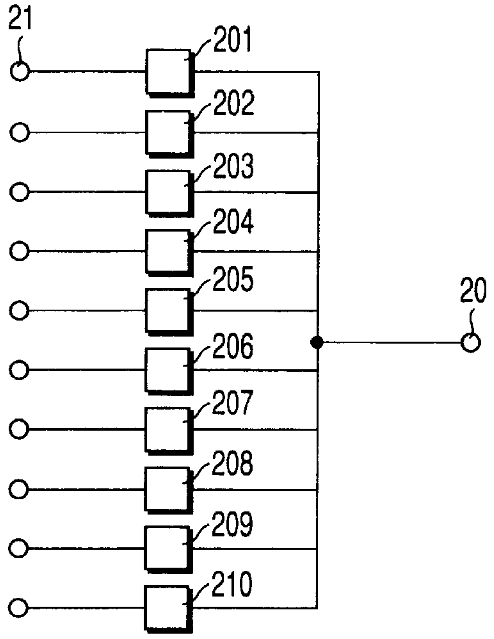
FIG. 6 is an equivalent circuit diagram showing the connection relationship between electron emitters to help explain a method of manufacturing field-emission type electron emitters according to a first embodiment of the present invention.

FIGS. 6 to 9 are diagrams to help explain a method of manufacturing surface conduction emitters according to a first embodiment of the present invention. FIG. 6 is an equivalent circuit diagram of electron emitters connected to one another. FIGS. 7A and 7B are a plan view and a sectional view of an electron emitter respectively, which schematically show the configuration of the emitter. FIGS. 8A and 8B are signal waveform diagrams of applied pulses. FIG. 8C shows the circuit of an electron emitter to which these pulses are applied. FIG. 9 is a graph of changes in the element current with respect to the processing time in the conductive activation process.

In the circuit configuration of FIG. 6, a plurality of surface conduction emitters, for example, ten electron emitters 201 to 210, each have one electrode terminal 20 connected in common and the other electrode 21 left open.

Figure 7A:
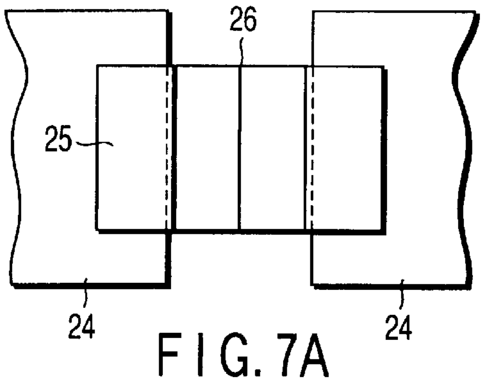
FIGS. 7A and 7B are a plan view and a sectional view schematically showing the configuration of an electron emitter to help explain a method of manufacturing field-emission type electron emitters according to the first embodiment.
Figure 7B:
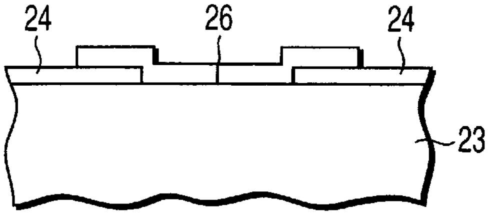

Each of the electron emitters has a structure shown in FIGS. 7A and 7B. As an example, this electron emitter is formed through the following processes.

First, a 200-nm-thick Ni thin film is formed on a quartz substrate 23 by sputtering techniques. On the Ni thin film, a resist film is patterned to form a mask. By mask exposure using the resist, a pair of electrode patterns 24 is formed. The clearance between the edges of the electrode patterns 24 facing each other in the area where an electron emitting section is to be formed is set to a specific value, for example, 3 μm. The substrate 23 is not limited to a quartz substrate. For instance, such an insulating substrate as a blue sheet glass substrate or a borosilicate glass containing less alkali may be used as the substrate 23. As for the materials for the electrodes, any thin-film electrodes may be used without any problem, provided that they are excellent in conductivity.

Next, a PdO ultrafine particle thin film is formed as a conductive thin film 25 by spin coating. After being dried, the thin film is patterned by mask exposure, with the result that the edges of the electrode patterns 24 are connected with the conductive thin film 25. The electrode width of the PdO conductive thin film 25 is set to, for example, 30 μm. The conductive thin film may be made of, for example, a metal, such as Pd, Pt, Ru, Ag, or Au, an oxide film, containing In, Pd, or Sb, a boride containing Hf, Zr, La, Ce, Y, or Gd, a carbide containing Ti, Zr, Hf, Ta, Si, or W, a nitride containing Ti, Zr, or Hf, or a semiconductor containing Si or Ge, or carbon. It is desirable that the conductive thin films should be ultrafine thin films.

Next, an electron emitting section 26 is formed in the conductive thin film 25 in a conductive forming process. The applied voltage in the forming process is a triangular pulse voltage, which is applied to all the electrode terminals 21 corresponding to the individual emitters. The common electrode terminal 20 is kept at GND. The triangular pulse is designed to have, for example, a waveform whose base is 1 millisecond in width and whose period is 20 milliseconds. The voltage at the apex starts with 5.0V and is raised in steps of 0.1V every 5 seconds. The current flowing at this time is monitored. When the current value has decreased below 1 μA, the application of the pulse voltage is stopped. In this way, an electron emitting section 26 is formed in the conductive thin film 25. Then, to improve the electron emitting capability, conductive activation is further continued.

Figure 8A:
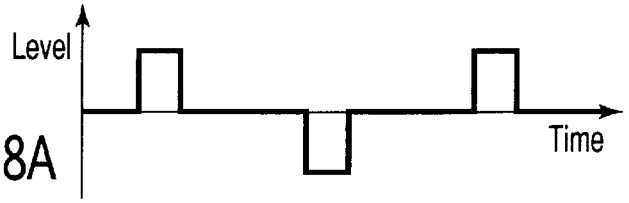
FIGS. 8A to 8C are waveform diagrams of pulse voltages applied to electron emitters and a schematic diagram of part of the circuit of an electron emitter to which the pulse voltage is applied, which help explain a method of manufacturing field-emission type electron emitters according to the first embodiment.
Figure 8B:
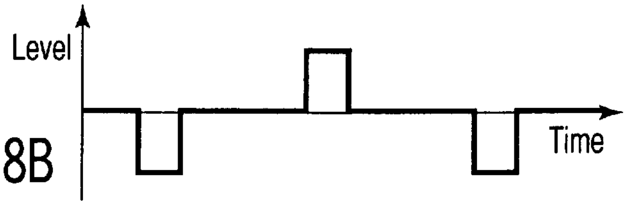
Figure 8C:
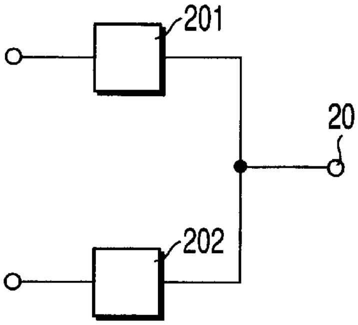
Figures 11A, 11B, 11C, 11D, 11E, 11F, 11G, 11H, 11I, 11J:
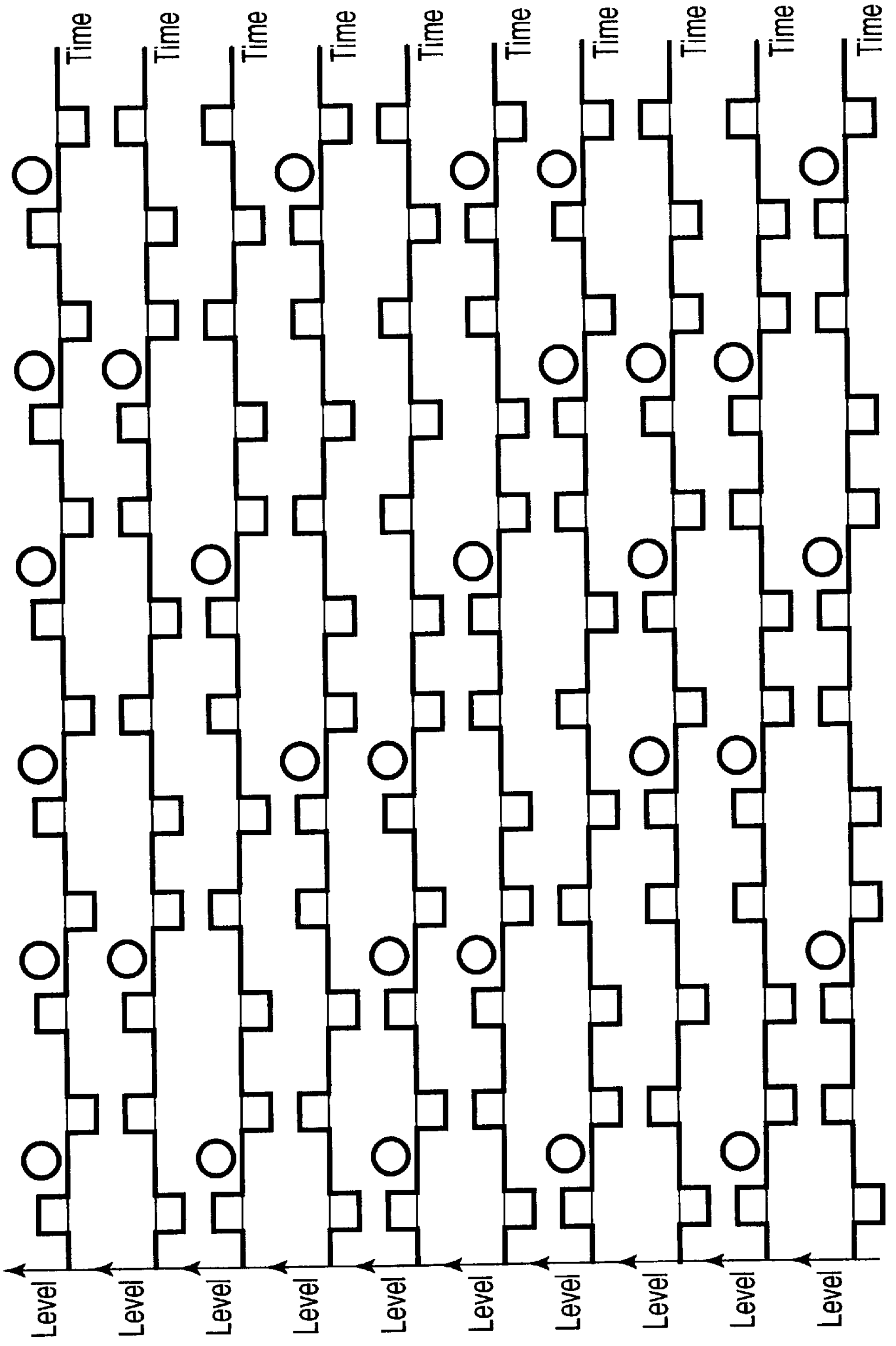
FIGS. 11A to 11J are waveform diagrams of pulses applied to electron emitters, which help explain a method of field-emission type electron emitters according to the second embodiment.

In the conductive activation process, the alternating-current rectangular voltage pulse shown in FIG. 8A and the reverse of the voltage pulse shown in FIG. 8B are applied to the electrode terminal 21 of the emitter 201 and that of the emitter 202 respectively as shown in FIG. 8C in such a manner that the electron emitters 201 and 202 are connected in series. The electrode terminals 21 corresponding to the remaining emitters 203 to 210 are kept at the GND. The common electrode terminal 20 is kept floating.

Here, the applied pulse is an alternating-current pulse voltage which has, for example, a voltage amplitude of ±14V, a pulse width of 3 milliseconds, and a period of 60 Hz. During the activation process, a vacuum atmosphere into which benzene has been introduced at $10^{-3}$ Pa is kept.

FIG. 9 shows an element current flowing through the electron emitters 201, 202 in the conductive activation process. The element current is increased gradually as the processing time passes and is finally saturated. When the element current has been almost saturated, the activation process is stopped. Similarly, a series connection of the electron emitters 203, 204, that of the electron emitters 205, 206, and those of the other pairs are subjected to the activation process one after another. When the activation process has been completed, an anode electrode is provided at the top of the element substrate so as to face the electron emitters. In a vacuum state, a high voltage of, for example, 1 kV is applied to the anode electrode. In this state, the element current and anode current in each of the electron emitters are evaluated sequentially. In the evaluation, the bias voltage of the electron emitter is set to 14V. An example of the result of the evaluation is shown in Table 1.

TABLE 1

| Element Pair | 1 | 2 | 3 | 4 | 5 | Average |
|---|---|---|---|---|---|---|
| Δ If (%) | 2.3 | 1.8 | 1.0 | 1.9 | 2.1 | 1.82 |
| Δ Ie (%) | 2.5 | 2.2 | 1.3 | 2.2 | 2.1 | 2.05 |

In Table 1, the difference ΔIf in element current If and the difference ΔIe in anode current Ie between electron emitters connected in series in each pair are represented by the ratio of the difference to the average value of the element current If and to the average value of the anode current Ie in each emitter pair, respectively.

Next, another substrate is prepared. With this substrate, each electron emitter is subjected independently to an activation process. A similar evaluation is made for the sake of comparison. The result of the comparison is shown in Table 2. Although each electron emitter has been formed independently, a pair of the electron emitters 201 and 202, that of the electron emitters 203, 204, and the other pairs are evaluated in the same manner under the same conditions as those of Table 1.

TABLE 2

| Element Pair | 1 | 2 | 3 | 4 | 5 | Average |
|---|---|---|---|---|---|---|
| Δ If (%) | 5.5 | 6.3 | 3.0 | 5.1 | 2.3 | 4.44 |
| Δ Ie (%) | 5.8 | 6.9 | 3.1 | 6.3 | 4.1 | 5.25 |

As seen from Table 1 and Table 2, subjecting a series connection of electron emitters to the activation process reduces variations in the element currents in the surface conduction emitters by 40% and further variations in the anode currents by about 40%. This is interpreted as follows: since the currents flowing through the electron emitters during the conductive activation process become the same, the characteristics of the completed surface conduction emitters are equalized more.

While in the first embodiment, all the conductive activation process has been carried out in series connections, series connection may be used in part of the conductive activation process, preferably in the time from when the activating current begins to be saturated until it has been saturated. The time required to carry out the conductive activation process in series connections is a little longer than the time required to carry out the activation process of single electron emitters. This is because it takes time for current to rise at the start of the process. Therefore, it is desirable that a single conducting process should be carried out in the first stage of the conductive activation and, after the element current has exceeded about 50% of the saturated value, a series connection should be subjected to a conducting process. In the first embodiment, it took about 30 minutes to activate a single electron emitter and it took about 45 minutes to activate a series connection of electron emitters. However, by performing a single conducting process until the element current has reached 50% of the saturated value and thereafter carrying out a series conducting process, the processing time is shortened to 35 minutes. In this case, too, variations in the characteristics are improved to almost the same extent.

While in the first embodiment, alternating-current pulse voltages completely symmetrical with each other have been applied to two electron emitters connected in series, the positive and negative pulse voltages are not necessarily the same, or symmetrical. In this case, the positive characteristic of a surface conduction emitter is asymmetrical with its negative characteristic. The asymmetrical characteristics hold in the individual electron emitters connected in series. That is, it is a necessary condition that the currents flowing through the electron emitters during the conductive activation process are in the same direction. Under this condition, electron emitters with more uniform characteristics can be obtained.

(Second Embodiment)

A method of manufacturing surface conduction emitters according to a second embodiment of the present invention will be explained.

In the first embodiment, variations in the characteristics of electron emitters connected n series in each pair in the electron emitters 201 to 210 of FIG. 6 decrease, but there are still variations in the characteristics of the emitters other than the pairs of electron emitters. In the second embodiment, to equalize the characteristics of all the electron emitters 201 to 210, combinations of pairs of emitters connected in series during conductive activation are changed one after another.

FIGS. 10A to 10D show waveforms of voltage pulses applied to four electron emitters 201 to 204 shown in FIG. 6 during conductive activation. To simplify the explanation, only the voltage pulses applied to the four electron emitters 201 to 204 are shown. Since those skilled in the art could infer voltage pulses to be applied to the other electron emitters by reference to the explanation of the second embodiment, an explanation of the voltage pulses to be applied to the other electron emitters will be omitted.

As emitter pairs during activation, electron emitters 201 and 202 are first selected, then electron emitters 203 and 204 are selected, and then electron emitters 201 and 203 are selected, and thereafter electron emitters 202 and 204 are selected. Similarly, electron emitters related to other pairs are selected. This emitter pair selection is repeated, thereby carrying out an activation process. In the case of four emitters, 4×3/2, or 6, pairs of emitters are selected one after another. In other words, pulses shown in FIGS. 10A and 10B are applied to the electron emitters 201 and 202 in period T1. Then, pulses shown in FIGS. 10C and 10D are applied to the electron emitters 203 and 204 in period T2. Pulses shown in FIGS. 10A and 10C are applied to the electron emitters 201 and 203 in period T3. Pulses shown in FIGS. 10B and 10D are applied to the electron emitters 202 and 204 in period T4. Similarly, the same holds true in period T5 and in period T6. In this process, voltage pulses with the reverse polarity are applied to the possible pairs of electron emitters in synchronization with the above pulses. This enables all the electron emitters to be activated in such a manner that they are combined to form pairs. In the circuit configuration of FIG. 6, when an N number of electron emitters are activated, the number of pairs M is M=N×(N−1)/2.

Here, the conditions for conductive activation are as follows: for example, an applied pulse is an alternating-current pulse voltage which has a voltage amplitude of ±14V, a pulse width of 3 milliseconds, and a period of 60 Hz. During the activation process, a vacuum atmosphere into which benzene has been introduced at $10^{-3}$ Pa is maintained. In the evaluation below, the bias voltage applied to the electron emitters is set to 14V.

The element current If and anode current Ie of each of the electron emitters formed as described above were measured. The variation of the element current If was 2.2% and variation of the anode current Ie was 2.4%. That is, it was verified that the element current If and anode current Ie were improved as compared with the case where variation of the element If was 4.9% and variation of the anode Ie was 5.5% in activating single electron emitters.

In the second embodiment, symmetrical pulses are applied to each emitter pair, thereby carrying out the conductive activation process. As a result, the time required to process all the electron emitters 201 to 210 is about five times as long as the time required to process a pair of electron emitters. However, as shown in FIGS. 11A to 11J, conducting pulses may be applied to a plurality of electron emitters at the same time and the phases of the applied pulses may be shifted sequentially. That is, a positive pulse is applied to one half of the even number of electron emitters and a negative pulse is applied to the other half of them in synchronization with each other. Then, the combinations of the emitters are changed in synchronization with the period of the alternating-current pulse voltage. This enables the characteristics of the emitters to be essentially equalized. FIGS. 11A to 11J show the pulses applied to the emitters 201 to 210 of FIG. 6 respectively. In FIG. 11A to 11J, each positive pulse is marked with a circle to make it easy to understand the state of its phase.

Use of such a conductive activation method enables not only the processing time to be almost equal to that in processing single electron emitters but also variations in the characteristics of the emitters to be reduced remarkably. Although it is desirable that the electron emitters should be combined so that as many electron emitters as possible may form pairs, such combinations are not an indispensable condition.

(Third Embodiment)

Figure 12:
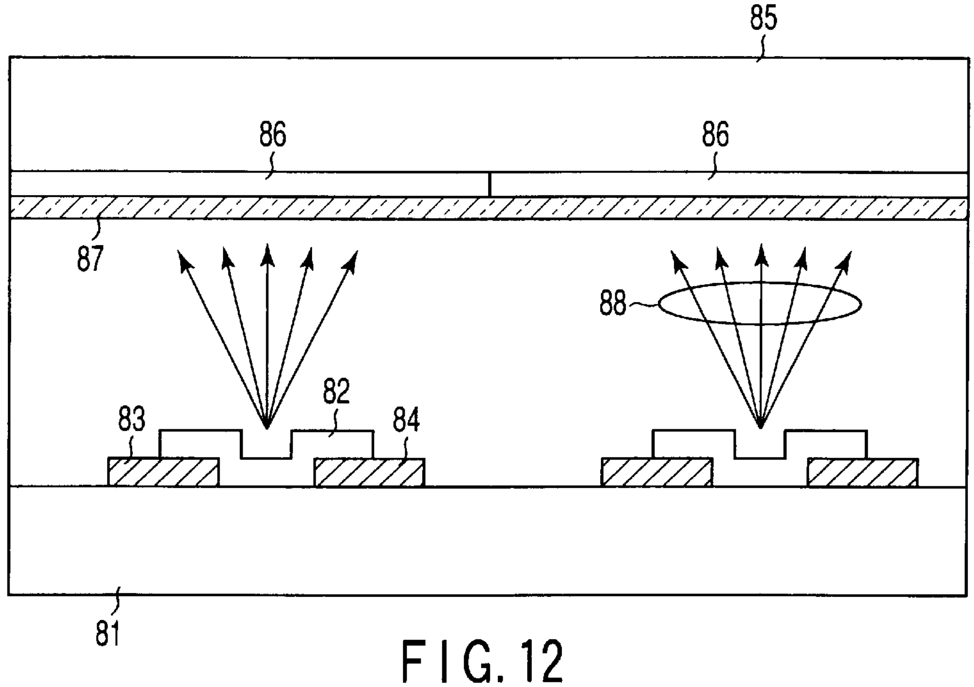
FIG. 12 is a sectional view schematically showing a fluorescent display unit which uses surface conduction emitters according to a third embodiment of the present invention.

FIG. 12 schematically shows a sectional configuration of a fluorescent display unit with surface conduction emitters according to a third embodiment of the present invention. Plane electron emitters 82 are arranged in a matrix on a glass substrate 81 serving as a rear plate. Each surface conduction emitter 82 is driven by voltages applied to electrodes 83, 84. A fluorescent material film 86 where each pixel emits light beams of R, G, and B is applied onto a glass plate 85 called a face plate, in such a manner that the film faces the rear plate. On the fluorescent material film 86, an anode electrode 87 made of aluminum is formed. The space between the two plates is kept evacuated. The electrons 88 emitted from the surface conduction emitters 82 are accelerated by the anode voltage and projected onto the fluorescent material layer 86. The energy of the accelerated electrons causes the fluorescent material 86 to be excited and emit light rays.

The principle of light ray emission is the same as that of a well-known cathode ray tube. In a cathode ray tube, the electron beam emitted from the electron gun is deflected by the deflecting coil or the like, thereby scanning the screen. In the fluorescent display unit using surface conduction emitters, however, the electron emitters provided for the individual pixels emit electrons, thereby exciting the fluorescent material layer of each pixel and causing the pixel to emit light rays. The clearance between the rear and face plates is several millimeters, which makes the thin display unit differ greatly from the cathode ray tube.

Figure 13:
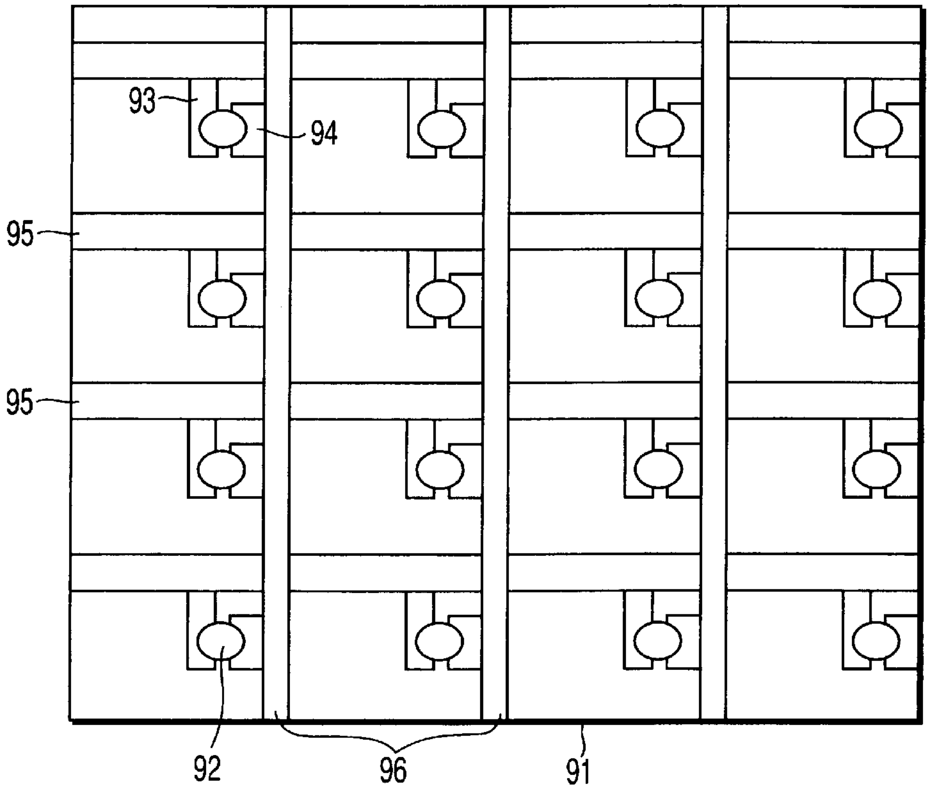
FIG. 13 is a plan view schematically showing the layout of the rear plate of the fluorescent display unit using surface conduction emitters according to the third embodiment.

FIG. 13 is a plan view of the rear plate. On a glass substrate 91, electron emitters 92 are arranged in a matrix. Each electron emitter 92 is connected to electrodes 93 and 94. A voltage is applied between these electrodes 93 and 94, thereby emitting electrons. In the surface conduction emitter array of FIG. 13, the conductive thin film to make electron emitters, electrodes 93, 94, wires 95, 96, and others can all be formed by printing. Although not shown, an insulating layer to insulate scanning lines 95 and signal lines 96 is also formed between the two lines by printing. This enables an emitter array to be formed at a substrate with a large area, which greatly helps produce a display unit with a large flat screen.

In FIG. 13, an electrode 93 is connected to a scanning line 95 and an electrode 94 is connected to a signal line 96. Applying a select pulse to the scanning lines 95 one after another causes a desired voltage to be applied to the electron emitter 92 connected to the selected scanning line according to the voltage of the simultaneously applied signal line voltage pulse. Then, because the amount of electrons emitted from the electron emitter 92 can be controlled according to the applied voltage, the necessary amount of electrons can be projected onto the fluorescent material, thereby displaying an image.

Since the electron beam excitation fluorescent display unit using such surface conduction emitters uses fluorescent material excitation light ray emission by electron beams with a high light rays-emitting efficiency, the power consumption is low even when the screen is large. The fluorescent material is caused to emit light rays for a very short time when the scanning line is selected, preventing the display from being held as found in a liquid-crystal display (LCD) or PDP, which enables very natural moving pictures to be displayed. Furthermore, the luminance of the screen does not depend on the visual angle and has a wide viewing angle characteristic. Furthermore, since the electron emitters operate on a little higher than ten volts, they can be driven by low-breakdown voltage drivers.

Figure 14A:
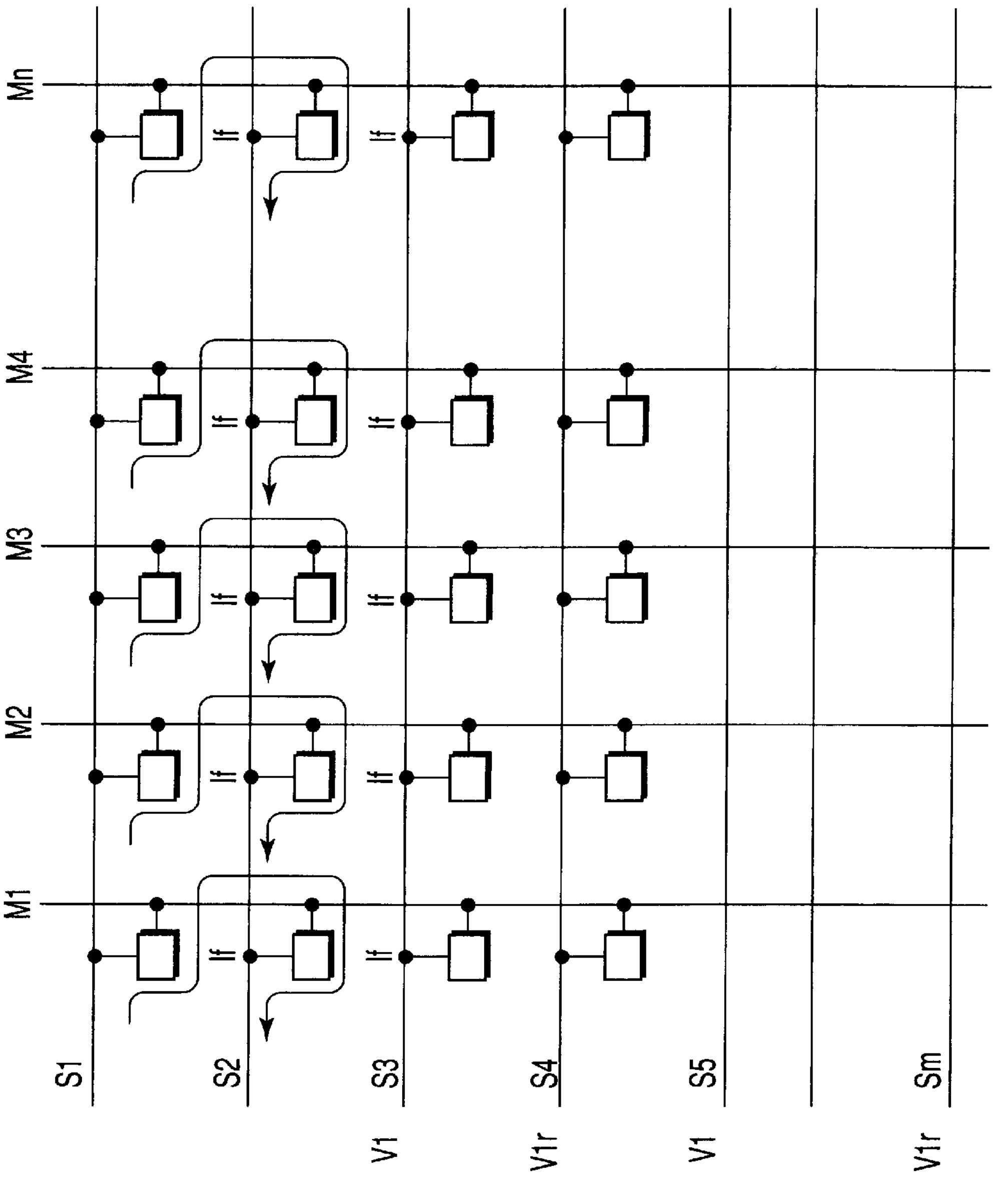
FIGS. 14A to 14C are an equivalent circuit diagram showing the connection relationship between electron emitters and waveform diagrams of pulse voltages applied to the scanning lines of the elements, which help explain a method of manufacturing plane field-emission elements according to the third embodiment.
Figure 14B:
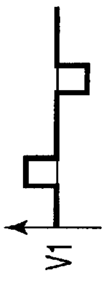
Figure 14C:
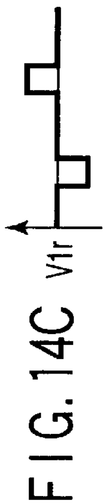

FIGS. 14A to 14C are diagrams to help explain a method of manufacturing surface conduction emitters in the above-mentioned display unit, and more specifically a method of applying voltages to the electron emitters.

In the third embodiment, a matrix array composed of surface conduction emitters as shown in FIG. 13 is formed on a substrate. In this matrix array, the number of electron emitters is 480 in the direction of the scanning line and 640×3=1,920 in the direction of the signal line, that is, 921,600 in total. This electron emitter substrate is combined with the anode electrode substrate at which a fluorescent material layer is formed, thereby forming an electron beam excitation fluorescent display unit. In the fluorescent material layer, a material which emits light rays corresponding to the three wavelengths of red (R), green (G), and blue (B). Fluorescent patterns are formed so as to correspond to the individual electron emitters. Each color of the light rays emitted from a pixel is composed of R, G, and B. The number of pixels is 480 in the direction of the scanning line and 640 in the direction of the signal line. Therefore, there are 480×640 pixels (=307,200 pixels) on the screen. The pitch of pixels is 300 μm in both the direction of the scanning line and that of the signal line. Thus, the electron emitter pitch is 300 μm in the direction of the scanning line and 100 μm in the direction of the signal line.

A method of manufacturing the surface conduction emitter arrays will be explained. A glass substrate is prepared. Electrodes 103 and 104 are made of a 200-nm-thick Ni thin film. The distance between electrodes is set to 15 μm. Lines 105 and 106 are made of a 2-μm-thick Cu-plated layer. The two lines are insulated from each other by a 2-μm-thick CVD oxide film. A conductive thin film, which is made of a PdO thin film, has a width of 80 μm. Triangular pulses are applied between the scanning line and the signal line, thereby carrying out a forming process to form an electron emitting section. In the conductive activation process, an alternating-current voltage with the reverse polarity is applied to the scanning lines as shown in FIGS. 14B and 14C, where the frequency is set to 15 Hz, the pulse width to 3 milliseconds, and the voltage amplitude to ±14V. During the activation process, a vacuum atmosphere into which benzene has been introduced at $10^{-3}$ Pa is maintained. The signal lines are designed to be floating.

In a concrete conducting method, a pulse voltage V1 of FIG. 14B is applied to a first scanning line S1 and the reverse pulse voltage Vlr of the pulse voltage V1 is applied to a second scanning line S2 as shown in FIG. 14A. The pulse voltage V1 is applied to a third, a fifth, . . . , a forty-seventh scanning line S3, S5, . . . , S47 and the reverse pulse voltage Vlr is applied to a fourth, a sixth, . . . , a forty-eighth scanning line S4, S6, . . . , S48. In this way, the first and second, the third and fourth, . . . , the forty-seventh and forty-eighth scanning lines S1 and S2, S3 and S4, . . . , S47 and S48 each form a pair, to which the pulse voltages are applied. At this time, since the electron emitters connected to the corresponding scanning lines are connected in series via signal lines as shown in FIG. 14A, the positive and negative pulse voltages corresponding to the pulse voltage V1 and reverse voltage V1*r* cause the same current to flow.

The electron emitters corresponding to the first to forty-eighth scanning lines S1 to S48 are activated by the pulse voltages V1 and V1*r*. The electron emitters connected to the scanning lines S49 to S96 are activated by a pulse voltage V2 obtained by shifting the phase of the pulse voltage V1 and its reversed pulse voltage V2*r*. Similarly, the electron emitters connected to the remaining scanning lines Sn to Sm are activated by pulse voltages V3, V3*r*, V4, V4*r*, , V10, V10*r* which differ in phase. In this way, all the electron emitters, which are connected in series, are activated by conduction. At this time, the signal lines are kept floating. That is, as many lines as 640×3=1920 do not require probing to apply potentials, which enables the configuration of the unit in the conductive activation process to be simplified much more than that of a conventional equivalent.

A comparison using the electron emitters along the same signal line has shown that variations in the characteristics of the electron emitters formed as described above have been improved about 25% with respect to those of conventional ones. Furthermore, a comparison of the electron emitters existing on the adjacent signal lines along the same scanning line has shown a similar improvement in variations, which verifies the effect of the series activation.

While in the third embodiment, the electron emitter pairs during series activation are fixed to the scanning lines 1 to 48, . . . , the position of the scanning line may be changed suitably according to the conducting pulse voltages V1, V2, . . . , which reduces variations further. In this case, too, the signal lines are kept floating and the number of scanning lines to which a positive pulse voltage is applied at the same time is made equal to the number of scanning lines to which a negative pulse voltage is applied at the same time. The scanning lines are selected arbitrarily. The position of the scanning line may be changed freely in synchronization with the pulse voltage.

(Fourth Embodiment)

Next, a method of manufacturing surface conduction emitters according to a fourth embodiment of the present invention will be explained.

In the fourth embodiment, a surface conduction emitter array composed of 480 scanning lines and 640×3 signal lines is formed beforehand as in the third embodiment. The wiring layout of the electron emitter substrate, material, and the forming of the conductive thin film are the same as those in the third embodiment.

Figure 16C:
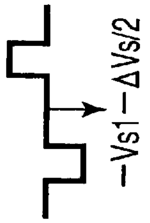
FIGS. 16A to 16C are an equivalent circuit diagram showing the connection relationship between electron emitters and waveform diagrams of pulse voltages applied to the scanning lines of the emitters, which help explain a method of manufacturing plane field-emission emitters according to a fourth embodiment of the present invention.
Figure 16A:
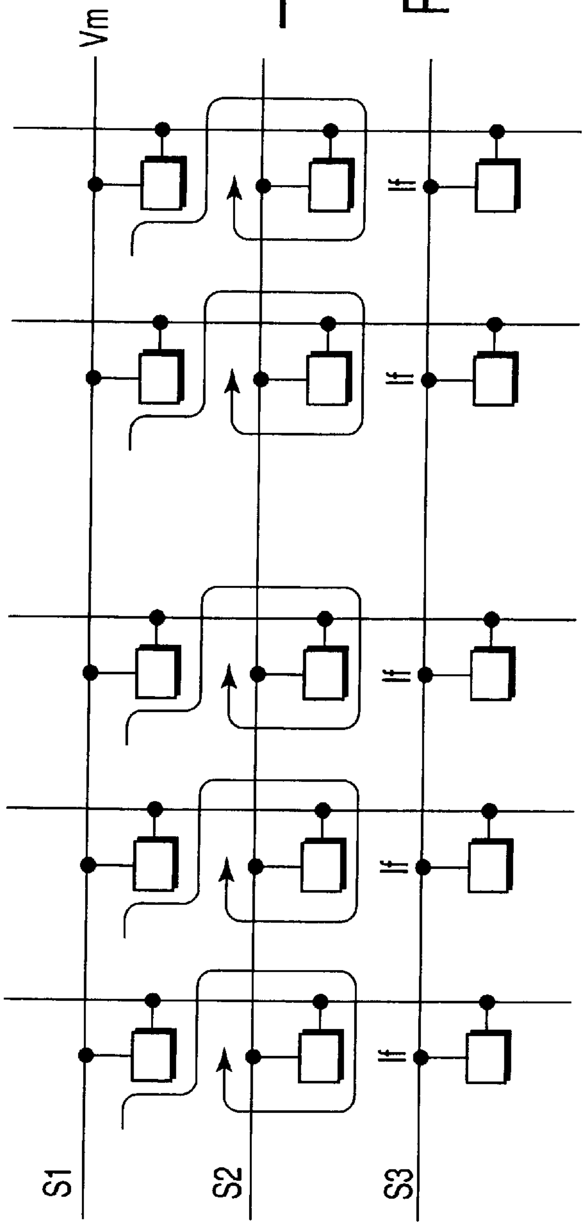

FIG. 16A shows a circuit configuration of electron emitters in the fourth embodiment.

The basic configuration of emitters is the same as in FIG. 14. To simplify an explanation, FIG. 16 shows a method of activating the electron emitters connected to the scanning lines S1, S2 by conduction. An alternating-current pulse voltage is used for causing the electron emitters to conduct. The alternating-current pulse voltage has, for example, a frequency of 60 Hz and a pulse width of 3 milliseconds. During the activation process, a vacuum atmosphere into which benzene has been introduced at $10^{-3}$ Pa is maintained.

Figure 16B:
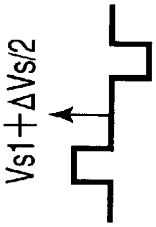

An alternating-current pulse voltage of ±14± ΔV (V) shown in FIG. 16B is applied to one end of the scanning line S1. An alternating-current pulse of FIG. 16C with the opposite phase to that of the alternating-current pulse applied to the scanning line S1 is applied to one end of the scanning line S2 opposite to the end of the line to which the bias of the scanning line S1 is applied. At this time, an emitter current flows through the two electron emitters connected to the scanning lines S1 and S2 along a certain signal line as shown in FIG. 16A, with the two electron emitters series-connected via a signal line. Similarly, current flows through all the electron emitters connected to the scanning lines S1 and S2.

As the measuring point is separated from the end of the electrode to which the bias is applied, a voltage drop is caused by the line resistance. At this time, a voltage drop ΔV is obtained by measuring the potentials Vm at the bias end of the scanning line and the end of the line opposite to the bias end. The voltage drop ΔV is added to the pulse voltage (of 14V in the fourth embodiment), thereby compensating for the voltage drop. All the signal lines are kept floating. A voltage of 0V is applied to the scanning lines to which the pulse voltage has not been applied.

As described above, a conductive activation process which has reduced the effect of voltage drops is carried out. FIG. 17 shows the relationship between the applied voltage to the electron emitters and the position of the scanning line in the activation process. The activation process is performed until the pulse current is saturated. In forming an actual electron emitter array, a pulse voltage is applied to the scanning lines in units of a specific number of lines as in the third embodiment. Shifting the phase of the pulse causes the pulse voltage to be applied to any scanning line almost constantly, thereby performing conductive activation.

With the fourth embodiment, by applying the pulses to be applied to two scanning lines to one end of one scanning line and the other end of the other scanning line instead of applying the pulses to one end sides of the respective scanning lines, the effect of voltage drops due to the position of the scanning line can be decreased in activating the electron emitters. Furthermore, the characteristics of the electron emitters can be equalized within the substrate by changing sequentially the combinations of the scanning lines to the electron emitters connected in series during the activation process.

The present invention is not limited to the above embodiments. While in the embodiments, the number of field-emission type electron emitters connected in series has been two, the number of electron emitters connected in series is not restricted to two. Using two or more electron emitters produces the effect of reducing variations in the characteristics. The conditions for the conducing process, including a vacuum atmosphere, are not necessarily limited to the values in the embodiments and may be varied suitably according to the specifications. Furthermore, the materials for the electrodes and conductive thin films constituting the field-emission type electron emitters may be changed according to the specifications.

This invention may be practiced or embodied in still other ways without departing from the spirit or essential character thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing field-emission type electron emitter unit comprising a plurality of field emission type electron emitters connected to each other, each of said electron emitters comprising a pair of electrodes formed on an insulating substrate, a conductive thin film formed between said pair of electrodes, and an electron emitting section configured to emit electrons and formed in said conductive thin film, said method comprising:

selecting a series connection of at least two of said electron emitters; and supplying current to said series connection of said at least two electron emitters to form said electron emitting sections.

2. The method according to claim 1, wherein said supplying current includes supplying a first pulse voltage with a specific polarity to one end of said series connection and a second pulse voltage with the reverse polarity to the other end of said series connection.

3. The method according to claim 2, wherein said supplying current includes supplying the first and second pulse voltages until the current flowing through said series connection of said at least two electron emitters is saturated.

4. The method according to claim 2, wherein said supplying current includes:

determining pairs related to all combinations of the series connections of said at least two electron emitters beforehand, and supplying current to said pairs related to said combinations one after another.

5. A method of manufacturing field-emission type electron emitters, comprising:

forming a plurality of pairs of electrodes on an insulating substrate, each of said pairs of electrodes being adjacent to each other;

forming conductive thin films, each arranged between said pairs of electrodes;

selecting a series connection of at least two of the electrode pairs; and supplying current to the series connection of the at least two electrode pairs and flowing the current through the respective conductive films to form electron emitting sections, each of the electron emitting sections being configured to emit electrons.

6. The method according to claim 5, wherein said supplying current includes supplying a first pulse voltage with a specific polarity to one end of said series connection and a second pulse voltage with the reverse polarity to the other end of said series connection.

7. The method according to claim 6, wherein said supplying current includes supplying the first and second pulse voltages until the current flowing through said series connection is saturated.

8. The method according to claim 6, wherein said supplying current includes:

determining pairs related to all combinations of series connections of said electron emitters beforehand, and supplying current to said pairs related to the combinations one after another.

9. A method of manufacturing a matrix electron emitter array substrate comprising an insulating substrate, a plurality of scanning lines which are formed on said insulating substrate to be substantially parallel with each other, a plurality of signal lines which are formed in a direction to cross said scanning lines to be substantially parallel with each other, said signal lines being isolated from said scanning lines, and field emission type electron emitters which are formed in the pixel areas defined by intersections of said scanning lines and said signal lines and which are arranged in a matrix, and each of said field emission type electron emitters comprising a pair of electrodes formed on said insulating substrate, one of said pair of electrodes connected to one of said scanning lines and another of said pair of electrodes connected to one of said signal lines, a conductive thin film formed between said pair of electrodes, and an electron emitting section configured to emit electrons and formed in said conductive thin film, said method comprising:

selecting a series connection of at least two of the electrode pairs; and supplying current to the series connection of the at least two electrode pairs and flowing the current through the respective conductive films to form electron emitting sections, each of the electron emitting sections being configured to emit electrons.

10. The method according to claim 9, wherein said supplying current includes supplying a first pulse voltage with a specific polarity to one of said scanning lines and a second pulse voltage with the reverse polarity to another of said scanning lines.

11. The method according to claim 10, wherein said supplying current includes supplying said first and said second pulse voltages until current flowing between said one of said scanning lines and said another of said scanning lines is saturated.

12. The method according to claim 10, wherein said supplying current includes:

determining pairs related to all combinations of the series connection of said electron emitters beforehand, and supplying current to said scanning lines corresponding to said pairs related to said combinations.

13. The method according to claim 10, wherein each of said scanning lines has a first end and a second end, and said first pulse voltage is supplied to said first end of one of said scanning lines and said second pulse voltage is supplied to said second end of another of said scanning lines in said forming said electron emitting section.

14. The method according to claim 9, wherein said insulating substrate is a glass substrate.

15. The method according to claim 9, wherein said signal lines are kept floating in said supplying current.

16. A method of manufacturing a matrix electron emitter array substrate comprising an insulating substrate, a plurality of row lines which are formed on said insulating substrate to be substantially parallel with each other, a plurality of column lines which are formed on said insulating substrate to be substantially parallel with each other in a direction to cross said row lines, said column lines isolated from said row lines, field emission type electron emitters, each configured to emit electrons, which are formed in pixel areas defined by intersections of said row lines and said column lines, said method comprising:

forming pairs of electrodes arranged in a matrix on said insulating substrate, one end of each pair of said electrodes connected to one of said row lines and the other end of each pair of said electrodes connected to one of said column lines, forming conductive thin films, each arranged between said electrodes in each pair;

selecting a series connection of at least two of the electrode pairs; and supplying current to the series connection of the at least two electrode pairs and flowing the current through the respective conductive films to form electron emitting sections.

17. The method according to claim 16, wherein said supplying current to said electron emitters includes applying voltages to a pair of said row lines to supply current to said electron emitters.

18. The method according to claim 17, wherein said two row lines are adjacent to each other.

19. The method according to claim 17, wherein each of said row lines has one and opposite ends, and said voltage is applied to one end of one of said two row lines and said opposite end of the other one of said two row lines.

20. The method according to claim 17, wherein one of said voltages has a specific polarity to a scanning line, and the other of said voltages has a reverse polarity.

21. A method of manufacturing a matrix electron emitter array substrate comprising an insulating substrate, a plurality of scanning lines which are formed on said insulating substrate to be substantially parallel with each other, a plurality of signal lines which are formed in a direction to cross said scanning lines to be substantially parallel with each other, said signal lines being isolated from said scanning lines, and field emission type electron emitters which are formed in the pixel areas defined by intersections of said scanning lines and said signal lines and which are arranged in a matrix, and each of said field emission type electron emitters comprising a pair of electrodes formed on said insulating substrate, one of said pair of electrodes connected to one of said scanning lines and another of said pair of electrodes connected to one of said signal lines, a conductive thin film formed between said pair of electrodes, and an electron emitting section formed in said conductive thin film, said method comprising:

forming said electron emitting sections by supplying current to said electron emitters connected in series, wherein said signal lines are kept floating in said forming said electron emitting section.

* * * * *